(12) United States Patent
Zhou et al.

(10) Patent No.: US 6,916,772 B2
(45) Date of Patent: Jul. 12, 2005

(54) SULFOXIDE PYROLID(IN)ONE ALKANOLAMINE CLEANER COMPOSITION

(75) Inventors: De-Ling Zhou, Sunnyvale, CA (US); Robert J. Small, Dublin, CA (US)

(73) Assignee: EKC Technology, Inc., Hayward, CA (US)

( * ) Notice: Subject to any disclaimer, the term of this patent is extended or adjusted under 35 U.S.C. 154(b) by 285 days.

(21) Appl. No.: 10/193,185

(22) Filed: Jul. 12, 2002

(65) Prior Publication Data

US 2003/0130149 A1 Jul. 10, 2003

Related U.S. Application Data

(60) Provisional application No. 60/304,758, filed on Jul. 13, 2001.

(51) Int. Cl.$^7$ .................................................. C11D 7/50
(52) U.S. Cl. ...................... 510/201; 510/505; 134/38; 134/40
(58) Field of Search ................................. 510/175, 176, 510/499, 500, 201, 212; 134/38, 40

(56) References Cited

U.S. PATENT DOCUMENTS

| | | | |
|---|---|---|---|
| 5,597,678 A | 1/1997 | Honda et al. | 430/331 |
| 5,612,304 A | 3/1997 | Honda et al. | 510/176 |
| 6,071,868 A * | 6/2000 | Kim et al. | 510/176 |
| 6,638,899 B1 * | 10/2003 | Wakiya et al. | 510/176 |

OTHER PUBLICATIONS

PCT International Search Report, dated Oct. 24, 2002.

* cited by examiner

*Primary Examiner*—Gregory Webb
(74) *Attorney, Agent, or Firm*—Morgan, Lewis & Bockius LLP

(57) ABSTRACT

The present invention relates to, inter alia, a composition for stripping photoresist from substrates comprising: about 5% to about 50% by weight of an alkyl substituted pyrrolidone, an alkyl substituted piperidone, or a mixture thereof, about 0.2% to about 20% of one or more alkanolamines, and about 50% to about 94% of a sulfoxide, sulfoxone, or mixture thereof. Advantageously, the composition can remove copper from a copper substrate at a rate of less than about 10 Å per minute when the substrate is immersed in the composition which is held at 70° C. for 30 minutes and rotated relative to the composition at about 200 revolutions per minute.

37 Claims, 7 Drawing Sheets

Control wafer Rnd#1

Control wafer Rnd#2

SULFOXIDE PYROLID(IN)ONE ALKANOLAMINE CLEANER COMPOSITION

This application claims the benefit of Provisional Application No. 60/304,758, filed Jul. 13, 2001.

FIELD OF THE INVENTION

The present invention relates generally to a stripping and cleaning composition and process for removal of polymeric materials and organic, organometallic and metal oxide residues from substrates. More particularly, it relates to such a composition and process for removing polymers, such as photoresist, polyimide, and the like and etching residues after etching processes in the fabrication of integrated circuits and similar processes. Most especially, it relates to such a composition and process which is effective for the removal of these materials while avoiding substantial attack on metal layers employed in integrated circuits, including titanium and copper layers.

BACKGROUND OF THE INVENTION

During the fabrication of microcircuits, the precise positioning of a number of appropriately doped regions on a slice of semiconductor is typically followed by the positioning of one or more interconnection patterns on the semiconductor. Positively doped resists have been extensively used as masking materials to delineate patterns onto a substrate so that the patterns can be subsequently etched into, or otherwise defined in, the substrate. The final steps in preparing the substrate then involve removing the unexposed resist material and any etching residue, if etching was used, from the substrate. It is critical that as much as possible of the residue and resist be removed to provide a wafer having sufficient integrity for subsequent use of the wafer in microcircuitry.

A semiconductor integrated circuit has very fine structures. The fine circuits are generally fabricated by: uniformly coating a photoresist on an insulating film or a conductive film (such as an oxide film, an Cu film, or Al alloy film) coated on a substrate; exposing and developing the photoresist to form a certain pattern; etching the substrate, or depositing a film thereon, by using the patterned photoresist as a mask; and thereafter removing the unnecessary photoresist.

Additionally, plasma etching, reactive ion etching, or ion milling are also used to define the pattern in a substrate. During such etching processing, an organometallic by-product compound can be formed on the sidewall of the substrate material. A recently developed technique effective for photoresist removal is plasma oxidation, also known as plasma ashing. However, while this process is effective for removing a photoresist, it is not effective for removing the organometallic polymer formed on the sidewall of the substrate during the etching process.

Polyimides are increasingly used in microelectronics as fabrication aids, passivants, and inter-level insulators. The use of a polyimide as a fabrication aid includes application of the polyimide as a photoresist, planarization layer in a multi-level photoresist scheme, and as an ion implant mask. In these applications, the polymer is applied to a wafer or substrate, subsequently cured or patterned by a suitable method, and removed after use. Many conventional strippers are not sufficiently effective in removing the polyimide layer once the polyimide has been subjected to curing. The removal of such polyimides is normally accomplished by boiling the substrate in hydrazine or exposure to oxygen plasma.

The stripping and cleaning compositions of the present invention remove photoresists without attacking the substrates themselves, particularly metal substrates such as copper, aluminum, titanium/tungsten, aluminum/silicon, aluminum/silicon/copper; substrates such as silicon oxide, silicon nitride, and gallium/arsenide; and plastic substrates such as polycarbonate. The requirement for a cleaning solution to remove all types of residue generated as a result of resist layers and etching of various types of metals, such as aluminum, aluminum/silicon/copper, titanium, titanium nitride, titanium/tungsten, tungsten, silicon oxide, polysilicon crystal, etc., presents a need for more effective cleaning chemistry in the processing area.

In addition to removing as completely as possible the resist material, particularly with the introduction of submicron process techniques to form wafers, there is a demand for cleaning technology for removing etching residue remaining following resist removal. Unfortunately, it has been found that no single cleaner is universal, in that it can clean the required materials without adversely affecting or hindering subsequent manufacturing operation or process steps involving the substrate. The requirement for a cleaning solution to remove photoresists and other residue of various types of metals, such as aluminum, aluminum/silicon/copper, titanium, titanium nitride, titanium/tungsten, tungsten, silicon oxide, polysilicon crystal, low-k materials, etc., presents a need for more effective cleaning chemistry in the processing area.

Known photoresist stripper compositions containing a combination of a polar solvent and an amine compound include:

1. U.S. Pat. No. 4,403,029 describes alkaline/solvent mixtures useful as photoresist strippers, but not necessarily cleaners, that include dimethylacetamide or dimethylformamide and alkanolamines.
2. U.S. Pat. Nos. 4,428,871, 4,401,747, and 4,395,479 describe cleaners containing 2-pyrrolidone, dialkylsulfone and alkanolamines.
3. U.S. Pat. No. 4,744,834 describes cleaners containing 2-pyrrolidone and tetramethylammonium hydroxide. Such stripping compositions, however, have only proven successful in cleaning "sidewall polymer" from the contact openings and metal line etching in simple microcircuit manufacturing involving a single layer of metal when the metal structure involves mainly Al—Si or Al—Si—Cu and the residue that contains only an organometallic compound with aluminum.
4. U.S. Pat. No. 4,617,251 teaches a positive photoresist stripping composition containing (A) a selected amine compound (e.g., 2-(2-aminoethoxy)-ethanol; 2-(2-aminoethylamino)-ethanol; or a mixture thereof) and (B) selected polar solvents (e.g., N-methyl-2-pyrolidinone, tetrahydrofurfuryl alcohol, isophorone, dimethyl sulfoxide, dimethyl adipate, dimethyl glutarate, sulfolane, gamma-butyrolactone, N,N-dimethylacetamide or mixtures thereof). The reference further teaches that water as well as dyes or colorants, wetting agents, surfactants and antifoamers may be added into this composition.
5. U.S. Pat. No. 4,770,713 teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N,N-diethyl butyramide or N-methyl-N-ethyl propionamide) and (B) a selected amine compound (e.g., monoethanolamine, monopropanolamine, or methyl-aminoethanol). The patent also teaches this stripper may optionally contain a water miscible nonionic detergent (e.g., alkylene oxide condensates, amides or semi-polar nonionics).

6. U.S. Pat. No. 4,824,763 teaches positive-working photoresist stripping composition containing (A) triamine (e.g., diethylene-triamine) and (B) a polar solvent (e.g., N-methyl-2-pyrrolidone, dimethylformamide, butyrolactone, aliphatic hydrocarbons, aromatic hydrocarbons, or chlorinated hydrocarbons).

7. U.S. Pat. No. 4,904,571 teaches printed circuit board photoresist stripper composition containing (A) a solvent (e.g., water, alcohols, ethers, ketones, chlorinated hydrocarbons or aromatic hydrocarbons); (B) an alkaline compound dissolved in said solvent (e.g., primary amines, secondary amines, tertiary amines, cyclic amines, polyamines, quaternary ammonium amines, sulfoniumhydroxides, alkali hydroxides, alkali carbonates, alkali phosphates or alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, or morpholine borone).

8. U.S. Pat. No. 5,102,777 teaches a positive photoresist stripper composition comprising (A) a solvent (e.g., a pyrrolidone compound, a diethylene glycol monoalkyl ether, a sulfur oxide compound, a sulfolane compound or a mixture thereof); (B) an amine (e.g., alkanolamine); and (C) a fatty acid (e.g., capric acid, lauric acid, talmitric acid, caprylic acid, myristic acid, oleic acid, stearic acid, linoleic acid, linolic acid, buthylic acid, abietic acid, isooctoic acid, isohexadecanoic acid, isostearic acid, behenic acid, undecylenic acid, hydroxystearic acid, chipanodonic acid, arachidonic acid, oleostearic acid, or 2-ethylhexadecanilic acid).

9. U.S. Pat. No. 5,279,791 teaches a stripping composition for removing resists from substrates containing (A) hydroxylamine; (B) at least one alkanolamine; and optionally (C) at least one polar solvent.

10. U.S. Pat. No. 5,308,745 teaches an alkaline-containing photoresist stripping composition comprising (A) a stripping solvent (e.g., 2-pyrrolidinone, 1-methyl-2-pyrrolidinone, 1-ethyl-2-pyrrolidinone, 1-propyl-2-pyrrolidinone, 1-hydroxyethyl-2-pyrolidinone, 1-hydroxypropyl-2-pyrrolidinone, diethylene glycol monoalkyl ethers, dialkyl sulfones, dimethyl sulfoxide, tetrahydrothiophene-1,1-dioxides, polyethylene glycol, dimethylacetamide or dimethylformamide; (B) a nucleophilic amine (e.g., 1-amino-2-propanol, 2-(2-aminoethoxy) ethanol, 2-aminoethanol, 2-(2-aminoethylamino)-ethanol or 2-(2-aminoethylamino) ethylamine); and (C) a non-nitrogen containing weak acid (e.g., acetic acid, phthalic acid, 2-mercaptobenzoic acid, 2-mercaptoethanol, 1,3,5-trihydroxybenzene, pyrogallol, resorcinol, 4-tert-butylcatechol, carbonic acid or hydrofluoric acid).

11. U.S. Pat. No. 5,334,332 teaches a photoresist resist stripping and cleaning composition comprising (A) hydroxylamine; (B) at least one alkanolamine; (C) water; (D) optionally, at least one polar solvent; and (E) optionally, a chelating reagent (e.g., thiophenol, ethylenediamine tetraacetic acid or 1,2-dihydroxybenzene) to reduce the surface metal contamination on wafers.

12. U.S. Pat. No. 5,399,464 teaches a stripping composition for removing positive organic photoresist from a substrate comprising (A) a triamine (e.g., diethylene triamine); (B) a nonpolar or polar organic solvent (e.g., N-methyl pyrrolidone).

13. U.S. Pat. No. 5,417,802 teaches a material useful for photoresist removal or post-metal etch clean up that comprises (A) a primary or secondary amine; (B) a solvent (e.g., dimethyl sulphoxide or dimethylacetylamide); and (C) organic ligands such as crown ethers or cyclodextrines.

14. Japanese Patent Application No. 63-208043 teaches a positive-working photoresist stripper composition containing (A) 1,3-dimethyl-2-imidazolidinone; (B) a water-soluble organic amine (e.g., monoethanolamine, 2-(2-aminoethoxy)-ethanol, or riethylenetetramine). The application also teaches a surfactant may be added to the stripper.

15. Japanese Patent Application No. 64-081949 teaches a positive-working photoresist stripper composition containing (A) a solvent (e.g., gamma-butyrolactone, N-methyl-formamide, N,N-dimethylformamide, N,N-dimethyl-acetamide or N-methylpyrrolidone); (B) an amino alcohol (e.g., N-butyl-ethanolamine or N-ethyldiethanolamine); and (C) water.

16. Japanese Patent Application No. 4-350660 teaches a stripper for positive photoresists comprising (A) 1,3-dimethyl-2-imidazolidinone (DMI), (B) dimethylsulfoxide (DMSO), and (C) a water-soluble amine (e.g., monoethanolamine or 2-(2-amino-ethoxy)ethanol), wherein the amount of the water-soluble amine is 7–30% by weight.

17. Japanese Patent Application No. 1999-197523 describes a stripper composition for photoresist used in manufacture of liquid crystal display device that includes 5–15 weight % of alkanolamine, 35–55% sulfoxide or sulfone compound, and 35–55 wt. % glycol ether.

18. Japanese Patent Application No. 08087118 describes a stripper composition that includes 50–90 weight % of alkanolamine, and 50–10% dimethyl sulfoxide or N-methyl-2-pyrrolidone.

19. Japanese Patent Application No. 03227009 describes a stripper composition that includes ethanolamine and dimethyl sulfoxide.

20. Japanese Patent Application No. 07069619 describes a stripper composition that includes alkanolamine, dimethyl sulfoxide, and water.

21. U.S. Pat. No. 5,480,585 and Japanese Patent Hei. 5-181753 disclose organic strippers comprising alkanolamine, a sulfone compound or a sulfoxide compound, and a hydroxyl compound.

22. The Japanese Laid-open Patent No. 4-124668 discloses a photoresist stripping composition including 20–90% by weight of an organic amine, 0.1–20% by weight of phosphoric ester surfactant, 0.1–20% by weight of 2-butyne-1,4-diol, and the remainder glycol monoalkylether and/or an aprotic polar solvent.

23. The Japanese Laid-open Patent Sho. 64-42653 discloses a photoresist stripping composition comprising over 50% by weight of dimethylsulfoxide (more desirably over 70% by weight), 1 to 50% by weight of a solvent such as diethyleneglycol monoalkylether, diethyleneglycol dialkylether, gamma-butyrolactone or 1,3-dimethyl-2imidazoledinone, and 0.1–5% by weight of a nitrogen-including organic hydroxyl compound, such as monoethanolamine. The reference recites that the amount of dimethylsulfoxide less than 50% by weight causes great reduction in stripping force, while the amount of nitrogen-including organic hydroxyl compound solvent over 5% by weight corrodes the metal (e.g., aluminum) film.

24. U.S. Pat. No. 5,091,103 to Dean et al. teaches a positive photoresist stripping composition containing: (A) N-alkyl-2-pyrrolidone; (B) 1,2-propanediol; and (C) tetraalkylammonium hydroxide.

Depending on the constituents of the compositions and the ratio thereof, the aforementioned stripping compositions exhibit greatly different characteristics in photoresist stripping force, metal corrosion properties, the complexities of a rinsing process following the stripping, environmental safety, workability and price. Several commercial products are now available to clean the photoresist and plasma etching residues left by plasma etching followed by oxygen ashing. For example, EKC 265, available from EKC Technology, Inc., is a plasma etching cleaning solution composed of water, alkanolamine, catechol and hydroxylamine. Such a composition is disclosed in U.S. Pat. No. 5,279,771.

Although these commercial products can dissolve photoresist and plasma-etching residues, the combination of water and alkanolamine contained therein can also attack the metallic layers deposited pattemwise on the substrate. The addition of a corrosion inhibitor to these products can mitigate the unwanted attack on the metallic layers and oxide layers deposited on the substrate. However, even in the presence of a corrosion inhibitor, they may attack certain corrosion-sensitive metal layers such as copper, aluminum or aluminum alloys (e.g., Al—Cu—Si), titanium nitride, titanium tungsten, and the like.

Additionally, many conventional post-etch cleaning compositions, including amine/solvent, hydroxylamine, fluoride, or choline hydroxide-based compositions, are not completely compatible with major low-k dielectric materials, such as hydrogen silsesquioxane (HSQ). The dielectrics may irreversibly and excessively change their physical dimensions and/or electrical/physical/chemical properties after treatment with these cleaning compositions. The changes may subsequently cause process, yield, and reliability problems in semiconductor devices.

The conventional post-etch cleaning compositions can also have problems in compatibility or cleaning in metal structures formed by high density plasma etch in a subtractive process. The post-etch residue can be difficult to clean and the metals can be prone to corrosion.

In addition, many of the conventional compositions contain highly toxic substances which can cause environmental/ health/safety concerns, in areas such as wafer cleaning processes, manufacturing/QC/transport, and waste treatment/disposal. Some compositions can also pose issues in other areas, such as cost of the raw materials used as well as manufacturing/wafer cleaning/disposal process/ equipment required, manufacturability, or aesthetics (some compositions have or contain substances of strong and unpleasant odors).

It is difficult to balance effective plasma etching residue removal and corrosion inhibition because chemical compositions of the plasma etching residues are generally similar to those of the metal layers or oxide layers on the substrate. The alkanolamine used in the prior art cleaning compositions was often times found to attack both the plasma etching residues and the substrate metal layers in the presence of water. Water is often present as a contaminant, for example from the atmosphere, from wet components, and the like, and may even be released from certain photoresist structures during dissolution. The problem of wafer-cleaning composition-induced corrosion has resulted in manufacturers resorting to use of alcohol or some other solvent, for example isopropyl alcohol, to remove the cleaner.

Moreover, if a post-cleaner rinse such as isopropyl alcohol was not used, the corrosion could be very severe. In addition, some types of the corrosion inhibitors have been found to retard plasma etching residue removal and other treatments. There is a need for strippers that are useful with corrosion-prone metal substrates, particularly for copper substrates, which do not corrode metal substrates in the presence of small quantities of water.

SUMMARY OF THE INVENTION

Figure 1A:
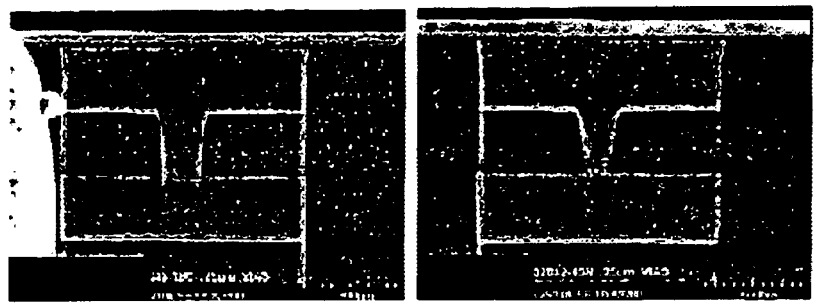
FIG. 1 is an SEM image of round #2 and show that "ears" of the remaining resist are still present on top of the capping layer.
Figure 1B:
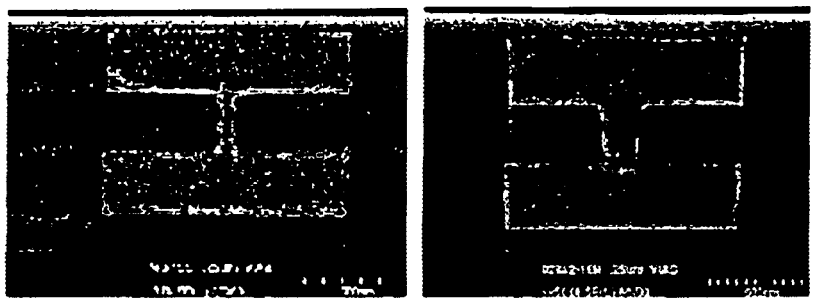
Figure 1C:
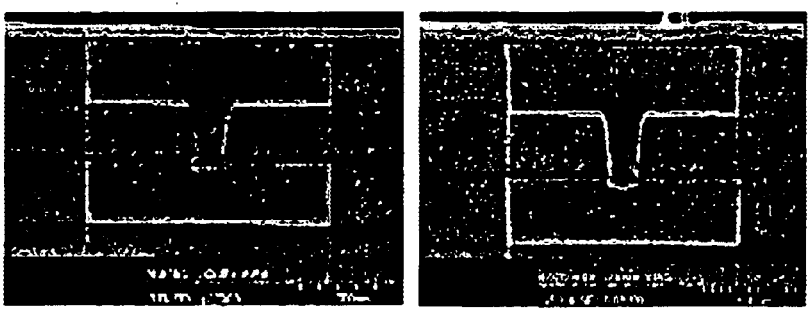
Figure 1D:
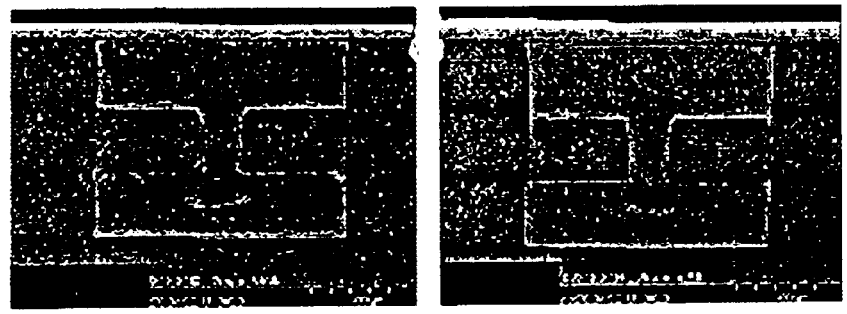
Figure 1E:
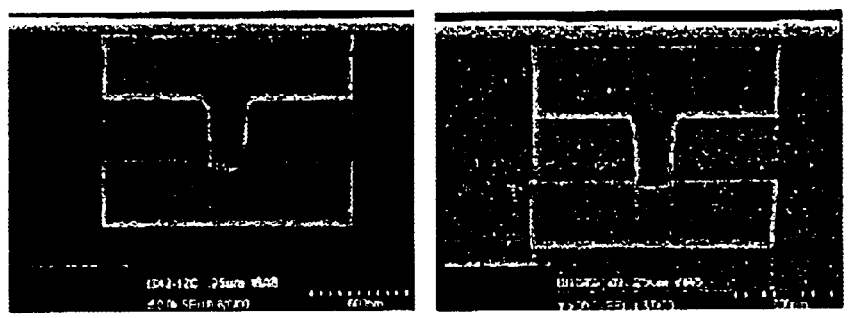
Figure 1F:
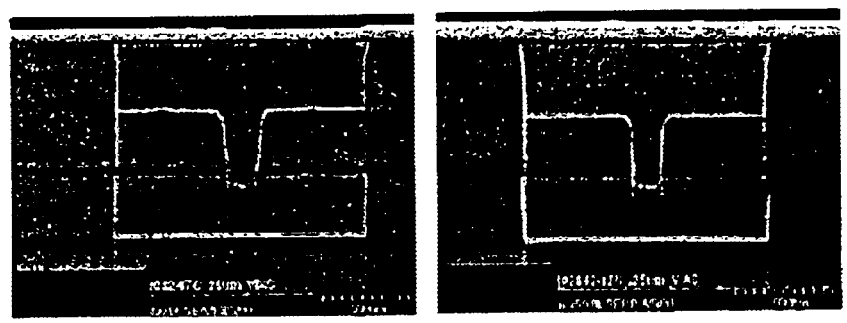
Figure 1G:
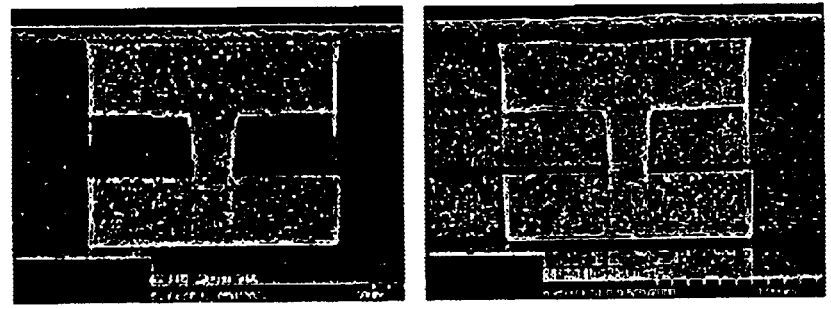
Figure 1H:
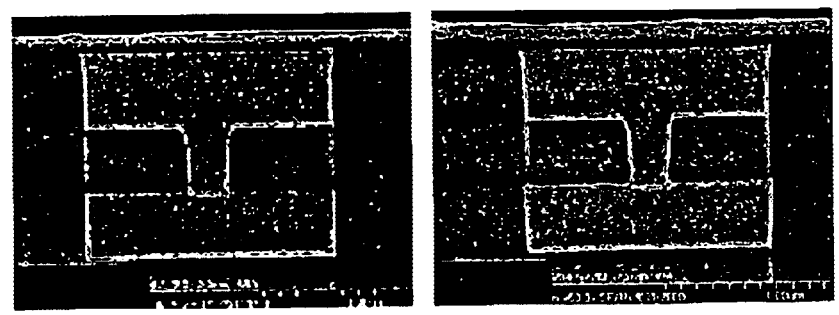
Figure 1I:
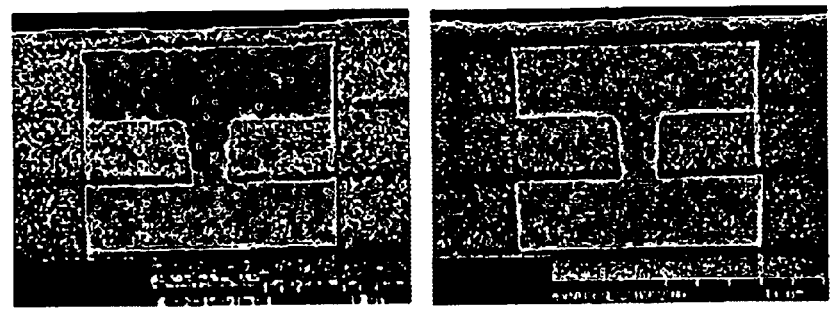
Figure 1J:
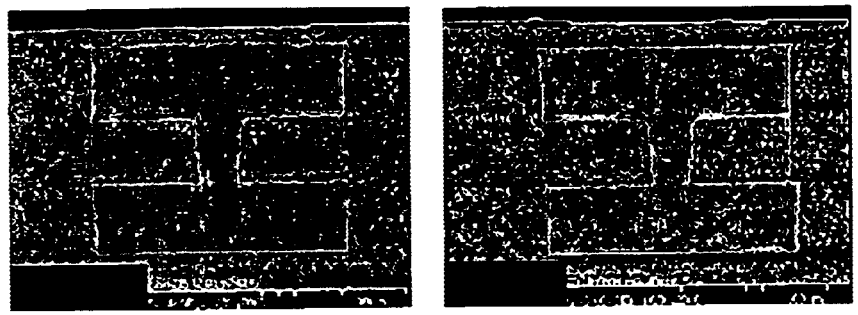
Figure 1K:
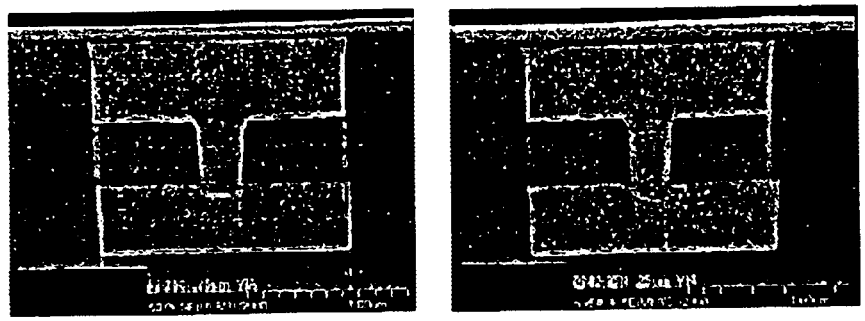
Figure 1L:
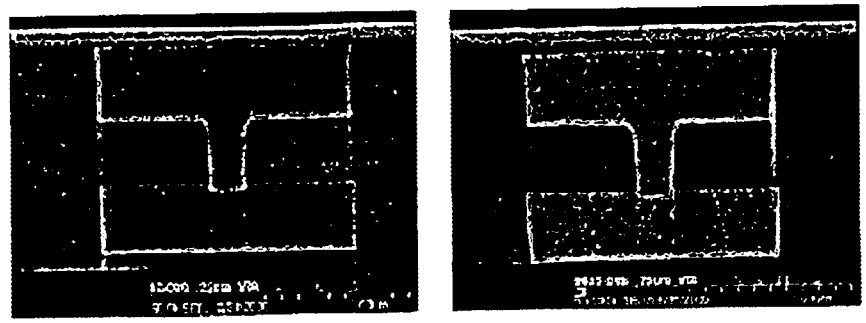
Figure 1M:
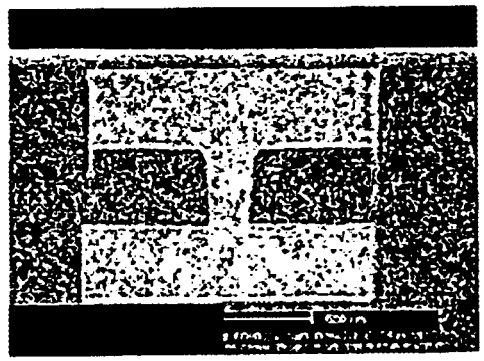
Figure 1M:
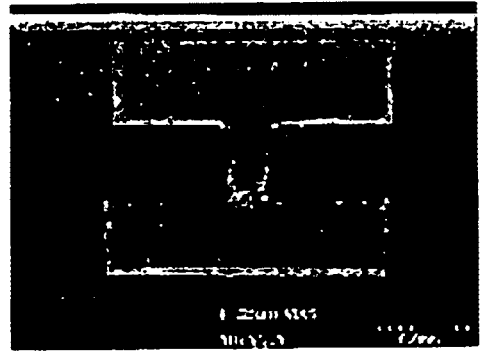
Figure 1N:
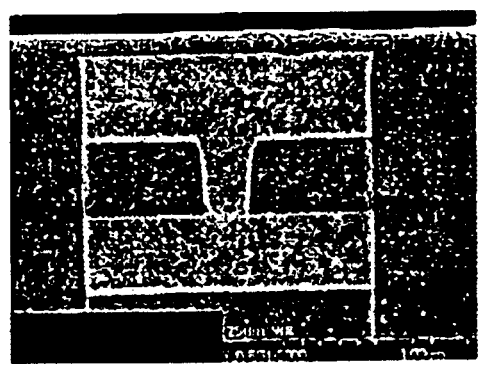
Figure 1N:
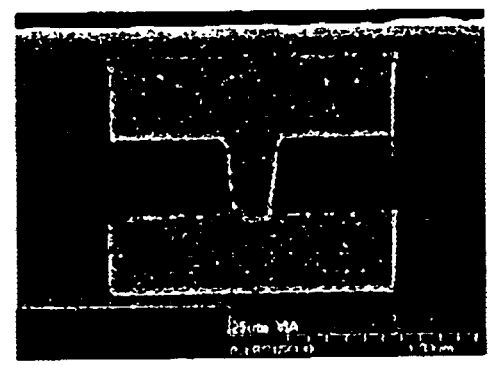

The invention relates to a composition for stripping photoresist from substrates that includes about 5% to about 50% by weight of an alkyl substituted pyrrolidone, an alkyl substituted piperidone, or mixture thereof; about 0.2% to about 20% of one or more alkanolamines, and about 50% to about 94% of a sulfoxide, sulfoxone, or mixture thereof. The composition removes copper from a copper substrate at a rate of less than about 10 Å per minute when the substrate is immersed in the composition which is held at 70° C. for 30 minutes and rotated relative to the composition at about 200 revolutions per minute.

In one embodiment the composition includes from about 15% to about 35% of an alkyl-2-pyrolidinone, from about 0.5% to about 10% of one or more alkanolamines, from about 60% to about 84% of a sulfoxide, sulfoxone, or mixture thereof, and no more than about 2% water.

In one embodiment the composition includes from about 20% to about 30% of an alkyl-2-pyrolidinone, from about 1% to about 5% of one or more alkanolamines, from about 66% to about 76% of a sulfoxide, sulfoxone, or mixture thereof.

In this embodiment the substituted pyrrolidone, substituted piperidone, or mixture thereof may consist essentially of N-methyl-2-pyrolidinone, N-hydroxyethyl-2-pyrrolidinone, or mixture thereof; the alkanolamine may consist essentially of monoethanolamine, 2-(2-aminoethoxy)ethanol, 2-(2-aminoethylamino)ethanol, monoisopropanolamine, diethanolamine, triethanolamine, 2-(methylamino)ethanol, or a mixture thereof, and the sulfoxide, sulfoxone, or mixture thereof may consist essentially of dimethyl sulfoxide (DMSO), dipropylsulfoxide, diethylsulfoxide, methylethylsulfoxide, diphenylsulfoxide, methylphenylsulfoxide, 1,1'-dihydroxyphenyl sulfoxide, or mixture thereof. Advantageously, the composition removes copper from the copper substrate at a rate of less than about 5 Å per minute when the substrate is immersed in the composition which is held at 70° C. for 30 minutes and rotated relative to the composition at about 200 revolutions per minute.

In one embodiment the substituted pyrrolidone, substituted piperidone, or mixture thereof consists essentially of N-methyl-2-pyrolidinone; the alkanolamine consists essentially of monoethanolamine, diethanolamine, 2-(methylamino)ethanol, or a mixture thereof; and the sulfoxide, sulfoxone, or mixture thereof consists essentially of dimethyl sulfoxide.

In one embodiment the composition comprises about 68% to about 74% of dimethyl sulfoxide, methyl sulfoxide, or mixture thereof; about 23% to about 29% of 1-Methyl-2-pyrrolidinone; and about 1% to about 5% of 2-(Methylamino)ethanol, diethanolamine, or mixture thereof.

Beneficially, the above compositions contain no more than about 1% water.

In one embodiment the composition further comprises at least one of a surfactant, chelating agent, or corrosion inhibitor, wherein the total concentration of surfactants, chelating agents, and corrosion inhibitors is less than about 5% by weight.

The invention also relates to a method of using the above compositions which include the steps of contacting the surface of a substrate with hardened photoresist thereon for a time and at a temperature sufficient to remove the photoresist; and rinsing the substrate with water, isopropyl alcohol, or mixture thereof. The method is particularly useful when the surface of the substrate comprises copper or a low-K material.

In one embodiment the composition for stripping photoresist from substrates includes: about 10% to about 30% by weight of an alkyl substituted pyrrolidone, an alkyl substituted piperidone, or mixture thereof; about 20% to about 50% of one or more alkanolamines, and about 20% to about 55% of a substituted or unsubstituted sulfoxide, substituted or unsubstituted sulfoxone, or mixture thereof. Beneficially this composition removes copper from a copper substrate at a rate of less than about 10 Å per minute when the substrate is immersed in the composition which is held at 70° C. for 30 minutes and rotated relative to the composition at about 200 revolutions per minute.

In one embodiment the composition comprises about 15% to about 25% of a substituted piperidone; about 30% to about 50% of monoethanolamine, 2-(2-aminoethoxy) ethanol, 2-(2-aminoethylamino)ethanol, monoisopropanolamine, diethanolamine, triethanolamine, 2-(methylamino)ethanol, or a mixture thereof; and about 25% to about 45% of an alkylsulfoxide.

In one preferred embodiment the composition includes about 17% to about 23% of 1,3-dimethyl-2-piperidone, 1,5-dimethyl-2-piperidone, or mixture thereof; about 40% to about 45% of monomethylethanolamine, diethanolamine, or mixture thereof; about 30% to about 40% of dimethyl sulfoxide, methyl sulfoxide, or a mixture thereof. Again, these compositions beneficially contain less than about 1% water. They may further comprise at least one of gamma-butyrolactone, diglycolamine, propylene glycol, morpholine, or mixture thereof. The composition may also further comprising at least one of a surfactant, chelating agent, or corrosion inhibitor, wherein the total concentration of surfactants, chelating agents, and corrosion inhibitors is less than about 5% by weight.

The invention also relates to a method of using the above compositions, particularly where the surface of the substrate comprises copper or a low-K material.

In one embodiment the composition for stripping photoresist from substrates comprises: about 5% to about 50% by weight of an alkyl substituted pyrrolidone, an alkyl substituted piperidone, or mixture thereof; about 0.2% to about 60% of one or more alkanolamines, about 20% to about 80% of alkylsulfoxide, alkylsulfone, or mixture thereof; and less than about 0.5% water. An advantage of this composition is that it removes copper from a copper substrate at a rate of less than about 10 Å per minute when the substrate is immersed in the composition which is held at 70° C. for 30 minutes and rotated relative to the composition at about 200 revolutions per minute.

In one embodiment the composition comprises about 10% to about 35% of 1-hydroxyethyl-2-pyrolidinone, N-methyl-2-pyrolidinone, 1,3-dimethyl-2-piperidone, 1,5-dimethyl-2-piperidone, or a mixture thereof; about 2% to about 45% of monoethanolamine, diethanolamine, 2-(methylamino) ethanol, or a mixture thereof; and about 30% to about 75% of dimethyl sulfoxide, methyl sulfoxide, or a mixture thereof.

In a preferred embodiment the composition includes about 20% to about 26% of 1-hydroxyethyl-2-pyrolidinone, N-methyl-2-pyrolidinone, 1,3-dimethyl-2-piperidone, 1,5-dimethyl-2-piperidone, or a mixture thereof; about 2% to about 45% of monoethanolamine, diethanolamine, 2-(methylamino)ethanol, or a mixture thereof; and about 30% to about 75% of dimethyl sulfoxide, methyl sulfoxide, or a mixture thereof. In some embodiments this composition does not change the refractive index of both low-k substrate SIOC and HSQ by more than 0.02 when the substrate is immersed in the composition which is held at 70° C. for 30 minutes and rotated relative to the composition at about 200 revolutions per minute.

In selected embodiments the composition removes copper from a copper substrate at a rate of less than about 5 Å per minute when the substrate is immersed in the composition which is held at 70° C. for 30 minutes and rotated relative to the composition at about 200 revolutions per minute. The compositions may further comprise at least one of a surfactant, chelating agent, or corrosion inhibitor, wherein the total concentration of surfactants, chelating agents, and corrosion inhibitors is less than about 5% by weight.

In one embodiment the composition comprises water in an amount less than about 0.5% does not increase the copper etch rate for the composition more than about 4 Å per minute greater than the etch rate of the composition when waterless.

The invention also relates to a method of using the above compositions which include the steps of contacting the surface of a substrate with hardened photoresist thereon for a time and at a temperature sufficient to remove the photoresist; and rinsing the substrate with water, isopropyl alcohol, or mixture thereof. The method is particularly useful when the surface of the substrate comprises copper or a low-K material. The time is between about 1 to about 60 minutes and the temperature os between about 45° C. to about 80° C.

DETAILED DESCRIPTION OF THE INVENTION

The novel stripping and cleaning compositions of the invention exhibit synergistically enhanced capabilities that are not possible from the use of the individual components, or the components in combination with other components.

It is one objective of the invention to provide resist removing compositions that: effectively clean hardened resist and other residues from substrates, inhibit redeposition of metal ions, and are corrosion resistant.

It is a further objective of the invention to provide effective photoresist stripping compositions that are compatible with copper, as well as other traditional metals, and which are compatible with low-K materials used in semiconductor manufacture. It is further an object to provide a composition and method of cleaning these materials that is not adversely affected by low levels of water contamination.

These and related objectives are attained through the use of the composition and process disclosed herein. The invention relates to a non-corrosive stripper useful for many combinations of metals and dielectric compounds. The formulations are especially useful on copper (PVD or electroplate) and low-k dielectrics (Coral), as well as on aluminum, TEOS, solder bumps, and the like. The composition is particularly useful with copper substrates, as it does not encourage copper corrosion.

In the manufacture of microcircuits, positive photoresists are used as an intermediate mask for transferring an original mask pattern of a reticle onto wafer substrates by means of a series of photolithography and plasma etching steps. One of the steps in the microcircuit manufacturing process is the removal of the patterned photoresist films from substrates. One method involves a wet stripping step in which the photoresist-covered substrate is brought into contact with a photoresist stripper solution.

As integrated circuit manufacturing has become more complex and the dimensions of circuit elements fabricated on silicon or other semiconductor wafers have become smaller, continued improvement in techniques used to remove photoresist or other polymeric materials and residues formed from such materials has been required. Photoresist or other polymeric materials, such as polyimides, are often subjected to ion implantation, plasma etching, reactive ion etching or ion milling during the fabrication processes to define patterns in the substrate. Additionally, oxygen plasma oxidation is often used for removal of photoresist or other polymeric materials after their use during the fabrication process has been completed. Such high energy processes typically result in the hardening of the photoresist and the formation of organometallic and other residues on sidewalls of the structures being formed in the fabrication process.

A variety of metal and other layers are commonly employed in integrated circuit fabrication, including aluminum, aluminum/silicon/copper, titanium, titanium nitride, titanium/tungsten, tungsten, silicon oxide, polysilicon crystal, and the like. The use of such different layers results in the formation of different organometallic residues in the high energy processes. In addition to being effective for removing photoresist or other polymeric materials or residues, stripping and cleaning compositions should also ideally not attack the different metallurgies used in integrated circuit fabrication. Generally, a photoresist stripping composition should have a high photoresist dissolving and stripping force, and should maintain a stripping force for various kinds of substrates.

The composition should further have good chemical properties, such as high stripping force, non-corrosiveness to metal, relative safety of humans, and inhibition of photoresist residues or impurities from remaining on the substrate.

The solvents used in this stripper composition should have a good solubility for cross-linked resist films. The solvent may be necessary to efficiently remove cross-linked resist films that are strongly adherent to the substrate. At the same time, the stripper should not promote corrosion of the substrate metal. The stripper is useful for most metal-dielectric combinations, including metals such as copper, aluminum, tungsten, titanium, chromium, etc.; and low-K materials such as HSQ, SiLK™, SiOC, Nanoglass™, HOSP™, Coral™, GaAs, TEOS, etc. The stripper according to the present invention is particularly useful on copper, and also on aluminium, TEOS, solder bumps, and the like.

In one embodiment the stripper contains at least three components, namely: (a) a cyclic amide, more preferably a substituted pyrrolidone (e.g.,1-hydroxyethyl-2-pyrolidinone or N-methyl-2-pyrolid(in)one) and/or a substituted piperidone (e.g., 1,3- and/or 1,5-dimethyl-2-piperidone, or a mixture thereof) in an amount ranging from about 5 parts to about 50 parts, preferably from about 10 parts to about 35 parts, more preferably from about 15 parts to about 30 parts by weight, for example between about 20 parts and 26 parts; (b) an amine, preferably a alkanolamine, more preferably monomethylethanolamine (2-(methylamino)ethanol), diethanolamine, or a mixture thereof, in an amount ranging from about 0.2 parts to about 60 parts, preferably from about 1 parts to about 50 parts, more preferably between about 2 part and about 45 parts by weight; and (c) a sulfoxide, sulfone, or mixture thereof, preferably an alkylsulfoxide, alkylsulfone, or mixture thereof, even more preferably comprising dimethyl sulfoxide, methyl sulfoxide, or a mixture thereof, in an amount ranging from about 20 parts to about 80 parts, more preferably from about 30 parts to about 75 parts.

Other performance chemicals, for example surfactants, chelating agents, corrosion inhibitors, and the like, can be added. Preferably the total concentration of these performance chemical additives is below about 10 parts by weight. Preferably the composition contains less than 1 part water.

In one embodiment the stripper has three components, namely: (a) a polar aprotic organic solvent having a dipole moment of more than 3.5, preferably a cyclic amide such as a substituted pyrrolidone, substituted piperidone, or mixture thereof, more preferably an N-alkyl-2-pyrrolidone, N-alkylpiperidone, or mixture thereof, most preferably an N-alkyl-2-pyrrolidone (e.g., N-methyl-2-pyrolid(in)one), in an amount ranging from about 5 parts to about 50 parts, preferably from about 15 parts to about 35 parts, more preferably from about 20 parts to about 30 parts by weight, for example between about 24 parts and 26 parts; (b) an amine, preferably an alkanolamine, more preferably monomethylethanolamine (2-(methylamino)ethanol), diethanolamine, or a mixture thereof, even more preferably monomethylethanolamine, in an amount ranging from about 0.2 parts to about 20 parts, preferably from about 0.5 parts to about 10 parts, more preferably between about 1 part and about 5 parts by weight, for example between about 2 parts and about 4 parts; and (c) a sulfoxide, sulfoxone, or mixture thereof, preferably an alkylsulfoxide, more preferably dimethyl sulfoxide, methyl sulfoxide, or a mixture thereof, in an amount ranging from about 50 parts to about 94 parts, more preferably from about 60 parts to about 84 parts, more preferably between about 66 parts to about 76 parts by weight, for example between about 70 parts and about 72 parts.

In this embodiment, if both substituted pyrrolidone and substituted piperidone are present, the weight ratio of substituted pyrrolidone to substituted piperidone is advantageously at least 2:1.

Other performance chemical additives, for example surfactants, chelating agents, corrosion inhibitors, and the like, can be added to this embodiment. Preferably the total concentration of these performance chemicals is below about 10 parts by weight.

An exemplary composition comprises on an additive-free basis: 71% of a mixture of dimethyl sulfoxide/ methyl sulfoxide, CAS # [67-68-5]); 26% of 1-methyl-2-pyrrolid(in)one, CAS # [872-50-4]; and 3% 2-(methylamino) ethanol, CAS # [109-83-1].

The composition is preferably water-free, but may contain some water, preferably less than about 4 parts, more preferably less than about 2 parts, most preferably less than about 0.5 parts. It has surprisingly been found that, unlike other similar compositions, compositions that are described in this embodiment do not exhibit increased etch rate when water is present in an amount of about 1% or less. This is an important breakthrough, because traces of water from the atmosphere, from rinsing, from inefficient drying, and the like, tend to contaminate the strippers, and prior art strippers exhibited unacceptable increases in corrosion of the metal layer, particularly copper.

In an alternate embodiment, the invention relates to a stripper composition with: (a) a polar aprotic organic solvent having a dipole moment of more than 3.5, preferably a cyclic amide such as a substituted or unsubstituted pyrrolidinone, substituted or unsubstituted piperidone, or a mixture thereof, more preferably a mixture of 1,3- and 1,5-Dimethyl-2-piperidone, [1690-76-2] and [86917-58-0], in an amount ranging from about 10 parts to about 30 parts, preferably from about 15 parts to about 25 parts, more preferably about 20 parts; (b) an amine, preferably one or more alkanolamines, more preferably monomethylethanolamine, diethanolamine, or a mixture thereof, in an amount ranging from about 20 parts to about 55 parts, preferably from about 30 parts to about 50 parts, for example from about 40 parts to about 45 parts; and (c) a sulfoxide, sulfoxone, or mixture thereof, preferably an alkylsulfoxide, more preferably including dimethyl sulfoxide, methyl sulfoxide, or a mixture thereof, in an amount ranging from about 20 parts to about 55 parts, more preferably from about 25 parts to about 45 parts, even more preferably between about 30 parts to about 40 parts by weight.

Other performance chemical additives, for example surfactants, chelating agents, corrosion inhibitors, and the like, can be added. Preferably the total concentration of these performance chemicals is below about 10 parts by weight.

In each of the above three embodiments, a small quantity, for example less than about 20 parts, preferably less than about 15 parts, of gamma-butyrolactone [96-48-0], diglycolamine, propylene glycol, morpholine, or mixtures thereof may be included.

In these embodiments the stripper has at least three components. One is the polar aprotic organic solvent. The polar solvent should preferably have a dipole moment more than 3.5. Preferably, the solvent's boiling point is more than 130° C. Amides are preferred, and cyclic amides are more preferred. A preferred class of aprotic organic solvents is N-alkyl lactams, such as N-alkyl-2-pyrolidones (e.g., N-methyl-2-pyrolid(in)one, N-hydroxyethyl-2-pyrrolidone, or a mixture thereof. Piperidones, particularly substituted piperidones, can be substituted for some or all of the pyrrolidinones in selected embodiments.

N-methylpyrrolidone is a strong solvent for dissolving the photoresist. By using N-methylpyrrolidone, which is a polar molecule and has high photoresist dissolving power, the stripping force of the composition is not appreciably reduced even when the stripping processes are repeated. In one embodiment, the cyclic amines are present in an amount from about 5% to about 50%, preferably from about 15% to about 35%, more preferably from about 20% to about 30% by weight, and most preferably from about 20% to about 28%.

The second component is an amine. The amine can be a primary, secondary, or tertiary amine. Suitable basic amine compounds include the following and mixtures thereof: hydroxylamine, hydrazine, 2-amino-2-ethoxy ethanol (DGA), monoethanolamine (MEA), diethylhydroxylamine, cholines, tetramethylammonium formate (TMAF), monoisopropanolamine (MIPA), diethanolamine (DEA), triethanolamine (TEA) and the like. Exemplary preferred compounds are monoethanolamine, 2-(2-aminoethoxy) ethanol, 2-(2-aminoethylamino)ethanol, monoisopropanolamine, diethanolamine and triethanolamine. The amine, preferably an alkanolamine, more preferably monomethylethanolamine (2-(methylamino)ethanol), is in one embodiment present in an amount from about 0.2% to about 20%, preferably from about 0.5% to about 10%, more preferably between about 2% and about 5% by weight.

Suitable sulfoxide solvents include the following and mixtures thereof: dimethyl sulfoxide (DMSO), dipropylsulfoxide, diethylsulfoxide, methylethylsulfoxide, diphenylsulfoxide, methylphenylsulfoxide, 1,1'-dihydroxyphenyl sulfoxide and the like. More generally, a suitable compound is either an organic sulfoxide corresponding to the following:

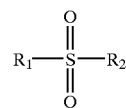

where $R_1$ and $R_2$ are H, OH or an alkyl, at least one of $R_1$ and $R_2$ is an alkyl, or a sulfone solvent corresponding to the following:

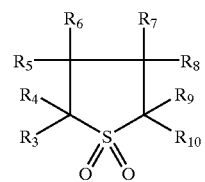

where $R_3$–$R_{10}$ are independently H or an alkyl group.

Suitable sulfone solvents include the following and mixtures thereof: dimethylsulfone, diethylsulfone, methylethylsulfoxone, diethylsulfoxide, methylethylsulfoxide, and dimethylsulfoxide (DMSO). The sulfoxide(s) or sulfone(s) or mixture(s) thereof, preferably contain an alkylsulfoxide, more preferably contain a dimethyl sulfoxide, methyl sulfoxide, or a mixture thereof. The dimethylsulfoxide can be a solvent for dissolving the photoresist and can control the surface tension between the surface of the photoresist and the stripping composition.

Other performance chemical additives, for example surfactants, chelating agents, corrosion inhibitors, and the like, can be added. Preferably, the total concentration of these is below about 10% by weight, more preferably below about 5% by weight.

Suitable corrosion inhibitors include inorganic nitrate salts such as ammonium, potassium, sodium and rubidium nitrate salts, aluminum nitrate and zinc nitrate. Other corrosion inhibitors include salicyl alcohol, salicyl aldoxime, gallic acid, gallic acid esters and pyrogallol.

Suitable chelating agents are described in commonly assigned U.S. Pat. No. 5,672,577, issued Sep. 30, 1997 to Lee, which is incorporated herein by reference. One suitable chelator is EDTA. The addition of a chelator can further improve the effectiveness of the formulation used as a etch residue or photoresist remover.

Suitable surfactants are selected from nonionic types, cationic types and anionic types of surfactants. Suitable surfactants include poly(vinyl alcohol), poly(ethyleneimine) and any of the surfactant compositions classified as anionic, cationic, nonionic, amphoteric, and silicone-based. Preferred surfactants are poly(vinyl alcohol) and poly(ethyleneimine). Preferably, a surfactant is present in the cleaning composition of the present invention, typically in the amount of about 1 ppm to 500 ppm by weight based on the total weight of the cleaning composition.

Some combinations of components require the addition of acids and/or bases to adjust the pH to an acceptable value. The acids suitable for use in the present invention can be organic or inorganic. The acids can include nitric, sulfuric, phosphoric, hydrochloric acids (though hydrochloric acid can be corrosive to metals), and/or organic acids, such as formic, acetic, propionic, n-butyric, isobutyric, benzoic, ascorbic, gluconic, malic, malonic, oxalic, succinic, tartaric, citric, and gallic acid.

The caustic components suitable for use to adjust the pH of the cleaning solution can include any common base, e.g., sodium, potassium, magnesium hydroxides, or the like. One difficulty with these bases is that they can introduce mobile ions into the final formulation. Mobile ions could destroy computer chips being produced today in the semiconductor industry. Other bases that contain less mobile ions can be used, including ammonium hydroxide or derivatives thereof, such as trimethyl-2-hydroxyethyl ammonium hydroxide (choline), and the like.

The method of cleaning a substrate using the cleaning compositions of the present invention involves contacting a substrate having residue thereon with a cleaning composition of the present invention for a time and at a temperature sufficient to remove the residue. The compositions of this invention are useful in either bath or spray application. This is an advantage over less effective compositions that require spray application to remove photoresist. Stirring, agitation, circulation, sonication or other techniques as are known in the art optionally may be used. The substrate is generally immersed in the cleaning composition. The time and temperature are determined based on the particular material being removed from a substrate. Generally, the temperature is from about ambient or room temperature to about 100° C., preferably about 55° C., and the contact time is typically from about 1 minute to about 60 minutes, preferably about 5 to about 30 minutes. Generally, the substrate will be rinsed after using the composition. Preferred rinse solutions are isopropanol and DI water (DIW).

In one embodiment, the formulation (hereafter designated Formula A) contains 71% of a mixture of dimethyl sulfoxide (and optionally methyl sulfoxide); 26% of 1-Methyl-2-pyrrolidinone; and 3% 2-(Methylamino)ethanol, and was used to strip positive photoresists when the substrate was immersed at 70° C. for 30 minutes, rinsed with deionized water, and dried in nitrogen. The formulation is also compatible with water/oxalic acid/tetramethylammonium hydroxide rinses commonly used in industry. Additionally, the flash point of this formulation is about 77° C. per ASTM D-3278, which provides a safety margin for most applications.

Similarly, water in an amount less than about 1% does not significantly increase the copper etch rate for a composition, hereafter designated Formula B, contains 35% dimethyl sulfoxide; 45% diethanolamine, and 20% of a mixture of 1,3- and 1,5-Dimethyl-2-piperidone.

Both Formula A and Formula B exhibit no observable phase change when stored at 4° C. for 0 to 5 days, though a slight increase in viscosity was noted.

The compositions of this invention are not recommended for use on Xerogel™.

The compositions are, however, useful on copper. Copper is rarely etched in processing, but it is readily corroded by most resist strippers. For copper compatibility tests, electroplated copper was used for most of the formulations, though PVD copper was employed for a few chemistries. Metal and low-K compatibility tests were performed with selected preferred embodiments of the invention. The metals include copper, aluminum, tungsten, titanium, chromium, etc.; and the low-K materials include HSQ, SiLK™, SiOC, Nanoglass™, HOSP™, Coral™, etc.

The compositions described show good compatibility with both conventional and advanced low-K dielectric materials and metals. They do not generally cause significant changes in the dielectrics or the metals. They clean effectively both the dielectric and the metal structures. They are especially suitable for cleaning of advanced low-K dielectric and high density plasma etched metal structures, for which many conventional compositions can have compatibility problems. They also have less environmental/health/safety concerns, lower cost, and better aesthetics in general.

EXAMPLES

The following abbreviations may be used in the examples:

TBPH=tetrabutyl phosphonium hydroxide;

DCH=dicarbethoxy hydrazine;

TMAF=tetramethylammonium formate;

MEA=monoethanolamine, Ethanolamine, 2-Aminoethanol; [141-43-5];

NMP=N-methyl pyrrolidone;

PG=propylene glycol;

PC=propylene carbonate;

HDA®=hydroxylamine;

DEHA=diethylhydroxylamine;

MIPA=monoisopropanolamine;

DMPD=1,3- and 1,5-Dimethyl-2-piperidone, [1690-76-2] and [86917-58-0], a mixture;

Gamma-BLO=4-Hydroxybutyric acid gamma-lactone, gamma-Butyrolactone, [96-48-0];

MMEA=2-(Methylamino)ethanol, Monomethylethanolamine; [109-83-1];

DEA=Diethanolamine, 2,2'-Imin6diethanol; [111-42-2];

DGA=Diglycolamine, Diethylene glycolamine, 2-(2-Aminoethoxy)ethanol; [929-06-6];

RT=Room temperature, i.e., approximately 20–25° C.

The following photoresists were tested:

(1) Shipley 510™ positive resist, 1.5 micron thickness, soft-baked and hard-baked;

(2) CARL™ bilayer systems;

(3) AZ P4620™ positive resists, 25–27-micron thickness, soft- and hard-baked;

(4) Ion implanted resist;and (5) OFPR 800™ resists, baked at different temperatures, without and with UV exposure.

Examples 1–48

Numerous compositions of the present invention were tested for etching of copper. CuSMTK (Cu, EP/Sematech) wafers were tested with the compositions by immersion at 70° C. for 30 mins. rotating at 200 rpm, followed by a deionized water rinse for 3–5 minutes and drying under nitrogen. The composition of the tested examples is provided in Table 1. The following results, in Table 2, were obtained by a 4-point test, where etch rate is given in Å/minute and the visual inspection is on a scale of 10 (no sign of etching) to 0 (unacceptable etching).

TABLE 1

Composition of Examples 1–48

| # | | | | | | |
|---|---|---|---|---|---|---|
| 1. | NMP (45%) | γ-BLO (15%) | Morpholine (15%) | TEA [triethanolamine] (25%) | | |
| 2. | NMP (45%) | γ-BLO (15%) | DEA [Diethanolamine] (40%) | | | |
| 3. | NMP (45%) | γ-BLO (15%) | DEA (20%) | TEA (20%) | | |
| 4. | NMP (45%) | γ-BLO (15%) | DGA (40%) | | | |
| 5. | NMP (45%) | γ-BLO (15%) | DGA (20%) | TEA (20%) | | |
| 6. | NMP (65%) | γ-BLO (23%) | MEA (12%) | | | |
| 7. | NMP (64%) | γ-BLO (18%) | MEA (18%) | | | |
| 8. | NMP (70%) | γ-BLO (22%) | piperazine (8%) | | | |
| 9. | NMP (72%) | γ-BLO (16%) | piperazine (12%) | | | |
| 10. | NMP (72%) | γ-BLO (10%) | DEA (18%) | | | |
| 11. | NMP (72%) | γ-BLO (10%) | DGA (18%) | | | |
| 12. | NMP (64%) | γ(24%) | MDEA (N-methyldiethanolamine %) (5%) | ethylenediamine (7%) | | |
| 13. | NMP (57%) | γ-BLO (23%) | MDEA (5%) | MMEA [Monomethylethanolamine] (15%) | | |
| 14. | DMSO (40%) | γ-BLO (10%) | MMEA (50%) | | | |
| 15. | DMSO (40%) | γ-BLO (10%) | DEA (50%) | | | |
| 16. | DMSO (30%) | DMPD [1,3/1,5-Dimethylpipendone] (10%) | γ-BLO (10%) | MMEA (50%) | | |
| 17. | DMSO (30%) | DMPD (10%) | γ-BLO (10%) | DEA (50%) | | |
| 18. | DMSO (35%) | DMPD (20%) | MMEA (45%) | | | |
| 19. | DMSO (35%) | DMPD (20%) | DEA (45%) | | | |
| 20. | DMSO (30%) | DMPD (20%) | MMEA (30%) | DEA (20%) | | |
| 21. | DMSO (53%) | DMPD (22%) | γ-BLO (10%) | MMEA (15%) | | |
| 22. | DMSO (50%) | DMPD (20%) | γ-BLO (10%) | MMEA (20%) | | |
| 23. | DMSO (48%) | DMPD (17%) | γ-BLO (10%) | MMEA (25%) | | |
| 24. | DMSO (45%) | DMPD (15%) | γ-BLO (10%) | MMEA (30%) | | |
| 25. | DMSO (41%) | DMPD (14%) | γ-BLO (10%) | MMEA (35%) | | |
| 26. | DMSO (38%) | DMPD (12%) | γ-BLO (10%) | MMEA (40%) | | |
| 27. | DMSO (70%) | DMPD (25%) | MMEA (5%) | | | |
| 28. | DMSO (70%) | NMP (25%) | MMEA (5%) | | | |
| 29. | DMSO (25%) | NMP (70%) | MMEA (5%) | | | |
| 30. | NMP (95%) | MMEA (5%) | | | | |
| 31. | DMSO (95%) | MMEA (5%) | | | | |
| 32. | DMSO (71%) | NMP (26%) | MMEA (3%) | | | |
| 33. | DMSO (50%) | DMPD (25%) | DEA (25%) | | | |
| 34. | DMSO (30%) | DMPD (50%) | DEA (20%) | | | |
| 35. | DMSO (30%) | DMPD (46%) | DEA (20%) | MMEA (4%) | | |
| 36. | DMSO (42%) | MEA (50%) | Brijá 56 <a nonionic surfactant> (8%) | | | |
| 37. | DMSO (58%) | MEA (30%) | CAT [catechol] (12%) | | | |
| 38. | DMSO (30%) | MEA (58%) | CAT (12%) | | | |
| 39. | DMSO (35%) | DMPD (24%) | DEA (40%) | SA [Salicylic acid] (1%) | | |
| 40. | DMSO (35%) | DMPD (24%) | DEA (40%) | Igepal CA-720 <a nonionic surfactant> (1%) | | |
| 41. | DMSO (35%) | DMPD (25%) | DEA (36%) | Quadrol Polyol (4%) | | |
| 42. | DMSO (35%) | DMPD (22.8%) | DEA (40%) | SA (1%) | Igepal CA-720 (1%) | phenyl-hydrazine-4-sulfonic acid (0.2%) |
| 43. | DMSO (35%) | NMP (20%) | DEA (45%) | | | |
| 44. | DMSO (23%) | PG [Propylene glycol] (26%) | MEA (50%) | DDBSA (1%) | | |
| 45. | DMSO (23%) | PG (26%) | DGA (50%) | DDBSA (1%) | | |
| 46. | DMSO (23%) | PG (26%) | MEA (25%) | DGA (25%) | DDBSA (1%) | |
| 47. | DMSO (66%) | PG (22%) | DGA (12%) | | | |
| 48. | DMSO (63%) | PG (22%) | DGA (12%) | DMSO$_2$ [Dimethylsulfone] (3%) | | |

TABLE 2

| Example # | Etch Rate (Å/min) | Visual | Note |
|---|---|---|---|
| 1 | 3.8 | ~10 | |
| 2 | 6 | 9–10 | |
| 3 | −3.4 | ~10 | |
| 3 | −16.1 | 9–10 | |
| 5 | 0.2 | ~10 | |
| 6 | −0.8 | ~10 | |
| 7 | −19.7 | ~7 | |
| 8 | 2.5 | ~10 | |
| 9 | 1.4 | ~10 | |
| 10 | −0.2 | 9–10 | |
| 11 | −3.6 | ~10 | |
| 12 Precipitates | NA | NA | |
| 13 | 4.5 | ~10 | |
| 14 | −4.3 | 7–8 | |
| 15 | −6.2 | 8–9 | |
| 16 | −2.9 | ~9 | |
| 17 | 2.1 | ~10 | |
| 18 | −13.7 | ~3 | |
| 19 | 2.3 | ~10 | |
| 20 | −9.2 | ~5 | |
| 21 | −34 | ~7 | |
| 22 | −51 | 6–7 | |
| 23 | −50 | ~6 | |
| 24 | −35 | 5–6 | |
| 25 | −37 | ~6 | |
| 26 | — | — | |
| 27 | −11.7 | ~10 | |
| 28 | −10.6 | ~10 | |
| 29 | −7.8 | ~10 | |
| 30 | −5.6 | ~10 | |
| 31 | −11.1 | ~10 | |
| 32 | −2.5 | ~10 | |
| 33 | −14.5 | 9–10 | |
| 34 | −5.8 | 9–10 | |
| 35 | −1.4 | 9–10 | |
| 36 | — | — | |
| 37 | — | — | |
| 38 | — | — | |
| 39 | — | — | |
| 40 | — | — | |
| 41 | — | — | |
| 42 | — | — | |
| 43 | −21.1 | ~9 | |
| 44 | −18.4 | ~8 | 80° C. |
| 45 | −20 | ~8 | 80° C. |
| 46 | 1.1 | ~8 | 80° C. |
| 47 | — | — | |
| 48 | — | — | |

Etching of the copper is undesirable for a resist cleaner. An excellent etch rate is typically less than 5 Å per minute. A good etch rate is generally less than 10 Å per minute. Unacceptable corrosion is greater than 20 Å per minute. It can be seen that many formulations tested provided acceptable to excellent results when tested with a copper substrate.

Selected formulations, e.g., those that contain DMSO at 40–50%, DMPD at 10–20%, γ-BLO at 10%, and balance MMEA, provided poor corrosion protection to copper.

Example 49

Selected low-K substrates were tested with a composition containing 35% DMSO, 20% NMP, and 45% DEA (the composition of Example 43) by immersion at 70° C. for 30 min rotating at 200 rpm, followed by a deionized water (DIW) rinse for 3–5 minutes and drying under nitrogen. The following results were obtained by an ellipsometer.

| Substrate | Etch rate {Å/min} | Refractive Index Change | IR Spectra |
|---|---|---|---|
| HSQ | −0.2 | 0 | OK |
| HOSP ™ | +2.2 | +0.017 | OK |
| SiLK ™ | +5.9 | −0.004 | OK |
| Coral ™ | +3.9 | −0.008 | OK |
| SiOC | −2.1 | +0.027 | OK |
| Nanoglass ™ | +0.8 | +0.011 | OK |
| TEOS | +1.5 | −0.006 | OK |

+: Indicates increase; −: Indicate decreases.

This data shows this composition is useful for removing photoresists from these low-K materials without causing significant, i.e., greater than about 10 Å per minute, etching of the materials.

Examples 50–54 and Comparative Examples 1–4

Post-Etch Cleaning of an Oxide/FOx/Al Via Structure

The vias of these Examples and Comparative Examples were intentionally and severely over-etched to simulate a difficult via cleaning situation. The over-etch is about 180 m into the aluminum substrate. As a result, heavy residue can be seen over the via sidewall and bottom. Both this pattern wafer and a blanket FOx wafer were tested. The blanket specimens were examined by ellipsometry and FTIR. The pattern specimens were examined by a Hitachi S4500 FE SEM. Several chemistries were found to clean effectively for both large and small size vias, as shown below.

The pattern wafer and a blanket FOx wafer were cleaved into specimens about one inch square, then immersed in process chemistries according to the time and temperature specified in Table 4. The immersion processes were followed by rinses with DIW or IPA/DIW and nitrogen blow-dry. The blanket specimens were then examined bu a Gaertner L2W16D.830 variable angle/dual wavelength ellipsometer and BioRad FT17SC FTIR. The thickness and refractive index (e.g., at 633 nm) were measured under a 45° polarization-45° incidence angle in a 5-point waferscan map. The FTIR spectra were obtained in transmission mode from wavenumbers of 4000 $cm^{-1}$ to 500 $cm^{-1}$. The pattern specimens were further cross-sectioned and examined by a Hitachi S4500 FE SEM.

TABLE 4

| | | Process conditions | | | |
|---|---|---|---|---|---|
| Example # | Chemistry | Temperature {° C.} | Time {min} | Rinse 1 | Rinse 2 |
| Comparative 1 | EKC265 | 65 | 15 | IPA | DIW |
| Comparative 2 | EKC525 | 45 | 15 | DIW | |
| Comparative 3 | EKC630 | RT | 5 | DIW | |
| Comparative 4 | EKC640 | RT | 5 | DIW | |
| 50 | ARX60M | RT | 5 | DIW | |
| 51 | ARX125M | RT | 5 | DIW | |
| 52 | 5LX263B | 65 | 15 | DIW | |
| 53 | SLXC268B | 65 | 15 | DIW | |
| 54 | SLX268E | 65 | 15 | DIW | |

The results of cleaning are summarized in Table 5, below. EKC265 was used as a benchmark, though its compatibility with FOx is known to be unsatisfactory. As expected, it cleaned the via effectively. SAC chemistries, both commercial (EKC630/640 available from EKC) and experimental (ARX60M/125M), did not clean completely. As these chem istries can etch the FOx material at high rate, they were all run at room temperature for 5 minutes to minimize their effect on the material. Several experimental aqueous chemistries including 5LX263B, 268B, and 268E, were found to clean effectively with good compatibility, indicated by small changes in thickness/RI and FTIR after process (See Table 6). The heavy residue created by intentional via overetch appears to be chemistry-specific.

Severe aluminum etch is seen in SEM photos (not shown), but is not believed to be caused by cleaning chemistries, as the etch is highly anisotropic and very limited lateral etch is observed. A severe wet aluminum etch is generally isotropic and can result in significant lateral etch (undercut), typically with similar magnitude to vertical etch. Therefore, this severe aluminum etch is believed to be a revelation of plasma overetch when the residue is removed.

TABLE 5

Cleaning of pattern wafer

| Example # | Chemistry | Condition | Results |
|---|---|---|---|
| Comparative 1 | EKC265 | 65° C. for 15 mins | Clean |
| Comparative 2 | EKC525 | 45° C. for 15 mins | Severe Al corrosion |
| Comparative 3 | EKC630 | RT for 5 mins | Not clean |
| Comparative 4 | EKC640 | RT for 5 mins | Not clean |
| 50 | ARX60M | RT for 5 mins | Not clean |
| 51 | ARiXI25M | RT for 5 mins | Not clean |
| 52 | 5LX263B | 65° C. for 15 mins | Clean |
| 53 | 5LX268B | 65° C. for 15 mins | Clean |
| 54 | 5LX268E | 65° C. for 15 mins | Clean |

TABLE 6

Thickness and retractive index changes after etching

| Example # | Chemistry | Condition | Thickness Change {Å} | RI Change |
|---|---|---|---|---|
| 50 | ARX60M | RT for 5 mins | −21 | 0.002 |
| 51 | ARX125M | RT for 5 mins | −26 | 0.004 |
| 52 | SLX263B | 65° C. for 15 mins | −32 | 0.008 |
| 53 | SLX268B | 65° C. for 15 mins | −10 | 0.001 |
| 54 | SLX268E | 65° C. for 15 mins | −250 | 0.005 |

Several chemistries were found to clean effectively for both large and small size vias. These include EKC265 and some experimental aqueous chemistries. These experimental chemistries show good compatibility with FOx blanket films, indicated by very limited changes in thickness, refractive index, and FTIR. SAC chemistries, both commercial (EKC630/640) and experimental (ARX60M/125M), appear to remove the residue to some extent, but not satisfactorily. To avoid excessive etch of FOx material, these SAC chemistries were all run at room temperature for short time. Severe aluminum etch is apparently present before processing. The etch appears after the chemistries remove the residue.

Example 55

Compatibility of Formula A with EKC 420™

(A) Mixing 420™ with equal volume of Formula A or DZX021F

When 420™ was gradually added into Formula A or DZX021F at stirring, no precipitates were observed during the adding process. Both the final mixtures were clear, colorless, and free of any visible particles.

pH (EKC 420™+Formula A; 1:1 volume): 12 (pH paper)
pH (EKC 420™+DZX021F; 1:1 volume): 5 (pH paper)
Ref. pH (EKC 420™): 1 (pH paper)

(B) Rinsing Formula A-processed substrates with EKC 420™

Bare electroplated copper (Sematech) and silicon substrates were immersed into DZX013F (Formula A) or DZX021F at 70° C. for a few minutes. After being taking out from the solution, the substrates were directly dipped into EKC 420™ in a beaker at RT. No visually visible particles could be spotted on the substrates following DIW rinsing for a few minutes.

Example 56

Compatibility of Formula A with GaAs

Thick blank GaAs substrates were used. Compatibility was assessed by visual inspection.

Testing conditions: 70° C./5 hrs/200 rpm→D1 Water rinsing→$N_2$ Drying

DZX013F (Formula A): Lost surface smoothness ("stains" on GaAs surface).

DZX021F: No any surface changes could be observed.

Example 57

Influence of Moisture in Formula A on Cu Corrosion

It appears that moisture in DZX013F (Formula A) does not increase Cu etching. Also, EKC 420™ appears compatible with both DZX013F (Formula A) and DZX021F. See Table 7.

TABLE 7

Copper Etch Characteristics

| Remover | Conditions {° C./min} | Δ Thickness {Å} | Etch Rate* {Å/min} | Visual Inspection {10:Best// 0:Worst} |
|---|---|---|---|---|
| DZX021F | 70° C. for 30 mins → Rinse w/DIW for 3–5 mins → dry with $N_2$ | −75 | −2.5 | ~10 |
|  |  | −29 | −1 | ~10 |
|  |  | −193 | −6.4 | ~10 |
| DZX021F + 0.5 wt. % $H_2O$ |  | −323 | −10.8 | ~10 |
| DZX013F |  | 68 | 2.3 | ~10 |
|  |  | −100 | −3.3 | ~10 |
|  |  | −19 | −0.6 | ~10 |
| DZX013F + 0.5 wt. % $H_2O$ |  | −29 | −1 | ~10 |

Wafer ID: CuSMTK (Cu, EP/Sematech & IWS)
St. Speed: 200 RPM
Test Method: 4-Point Probe Visual Inspection
*positive numbers => thickness increases; negative numbers => thickness decreases.

Table 8 below shows a Comparison of the etch rate on a CU/PVD substrate, compared to an electroplated copper substrate.

TABLE 8

Copper Etch Characteristics

| Remover | Conditions {° C./min} | Δ Thickness {Å} | Etch Rate* {Å/min} | Visual Inspection {10:Best//0:Worst} |
|---|---|---|---|---|
| | | Cu/PVD | | |
| DZX021F (Formula A) | 70° C. for 30 mins → Rinse w/DIW for 3-5 | -85 | -2.8 | ~10 |
| DZX013F | mins → dry with N$_2$ | -79 | -2.6 | ~9 |
| EKC 505 ™ | | -100 | -3.3 | ~8-9 |
| | | Cu/EP | | |
| DZX021F (Formula A) | 70° C. for 30 mins → Rinse w/DIW for 3-5 mins → dry with N$_2$ | -75 | -2.5 | ~10 |
| | | -29 | -1 | ~10 |
| | | -193 | -6.4 | ~10 |
| DZX013F | | 68 | 2.3 | ~10 |
| | | -100 | -3.3 | ~10 |
| | | -19 | -0.6 | ~10 |
| EKC 505 ™ | | 21 | 0.7 | ~10 |
| | | -91 | -3 | ~10 |
| | | -140 | -4.7 | ~10 |
| | | 82 | 2.7 | ~10 |

Wafer ID: CuSMTK (Cu, EP/Sematech) CuPVD (Cu, PVD/IWS)
Inspection St. Speed: 200 RPM
Test Method: 4-Point Probe Visual
*positive numbers => thickness increases; negative numbers => thickness decreases.

Example 58
Compatibility of Different Etch Chemistries with a Variety of Substrates The low-K materials evaluated were organosilicate glass (OSG) types Coral (Novellus) and HOSP (Allied Signal), and porous types LKD (JSR) and XLK (Dow Coming). Oxide dual damascene wafers were used to evaluate copper cleaning efficiency. For compatibility with low-K materials, blanket films and trench patterned wafers were exposed to the same treatments.

The blanket films exposed to the various wet chemicals were inspected by transmission FTIR and visually for color changes. These data were compared with an untreated control wafer. The OSG trench wafers were processed further and electrical test data were generated for the various treatments.

On the OSG films, the chemical with the best copper cleaning efficiency and most film compatibility was C. On the porous films, only chemical K was completely compatible, but exhibited low via chain yields. Chemical C was used again as chemical G in round #2.

For LKD wafers, the etching chemistries can be ranked roughly in order of decreasing compatibility as follows: K>J, E>A, I, F, U, C, L>H, B. For XLK wafers, the order of decreasing compatibility is as follows: K>E>F, I, B, A, J, H>D, G, L.

SEM images of round #1 (FIG. 1) show that chemical A might cause some voiding and densification of the XLK structure. This may also be the case for C, D, and F. Chemical B causes SiN~attack at the bottom of the trench. Treatment E might best resemble the control The SEM images of round #2 (FIG. 1) show that "ears" of remaining resist are still present on top of the capping layer. This means that a previous ashing step was not completed. The condition of the etch or ash chamber or maybe aging effects of the photoresist mask may be the source of this.

Figure 2:
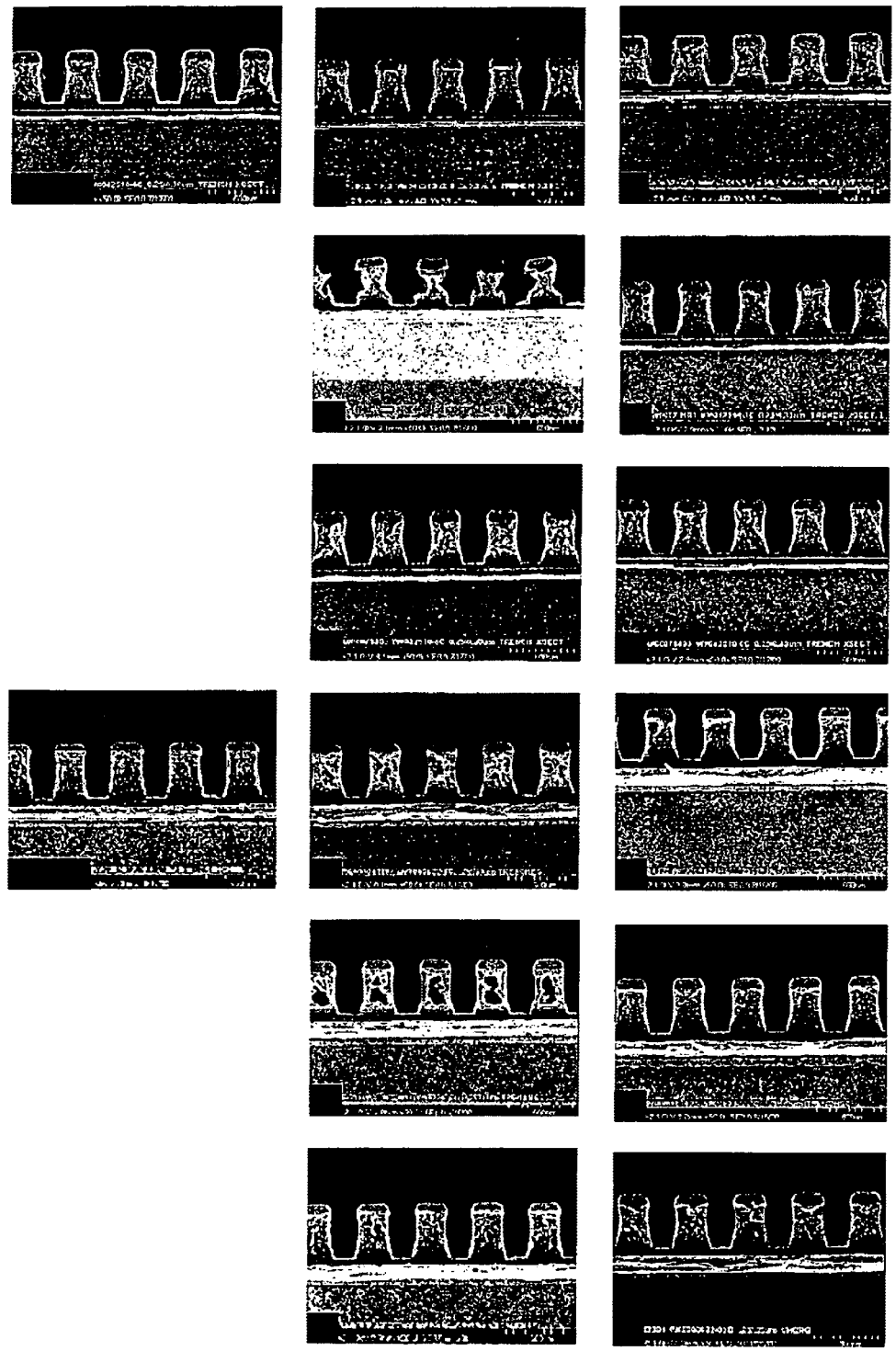
FIG. 2 is an SEM image of XLK.
Figure 3:
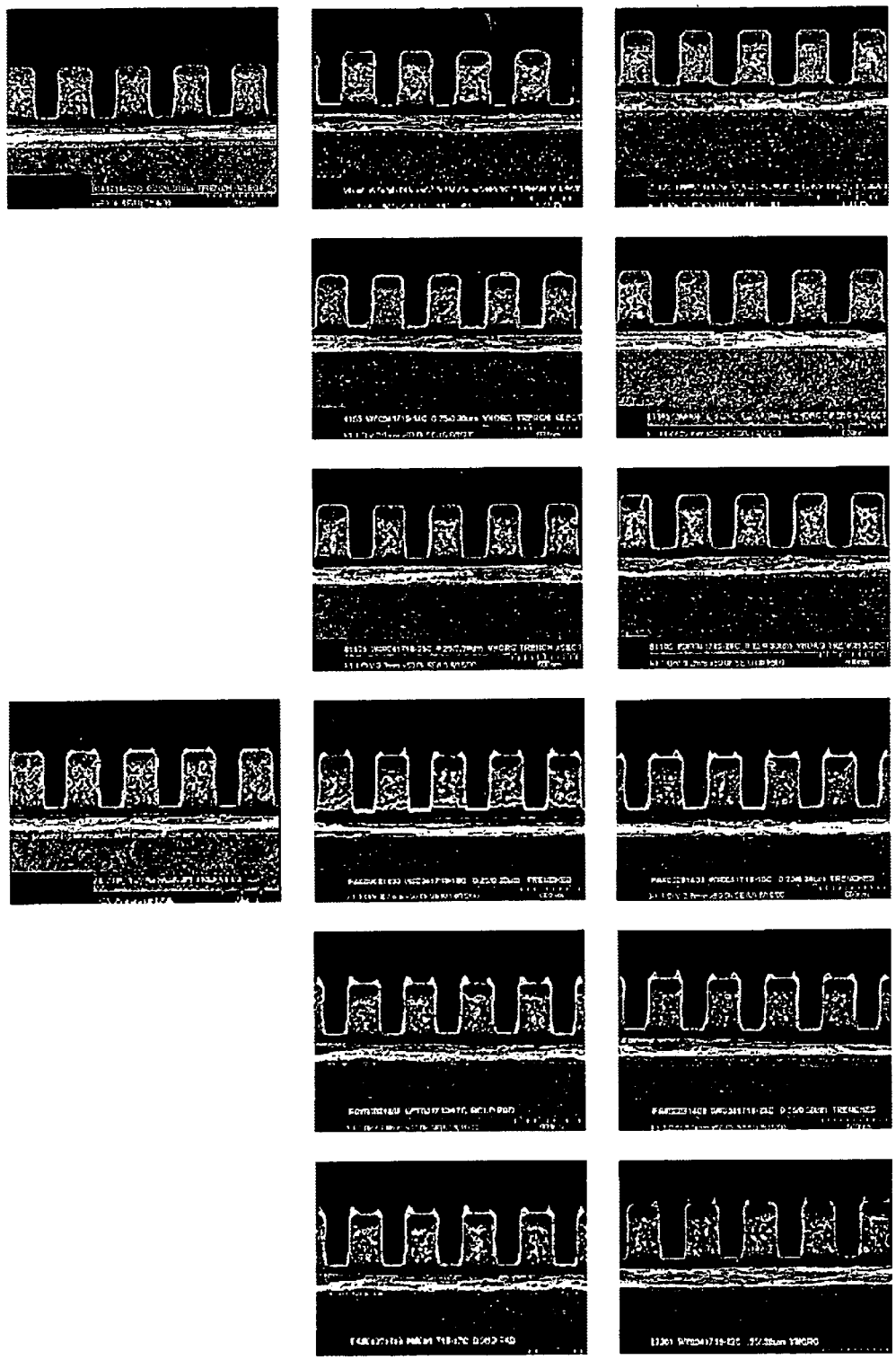
FIG. 3 is an SEM image of LKD.

Comparing the XLK SEM images (FIG. 2) with those of LKD (FIG. 3), XLK appears to have less visual damage than LKD.

In Table 9, Kelvin contact resistance (Kelvin) and 360k via chain yield, which correlate to via clean efficiency, are shown in the columns 3 and 4. The following columns roughly evaluate the compatibility of the low-k material with the particular chemical treatment. As far as efficient via cleaning and wet chemical compatibility to HOSP are concerned, chemical C seems to indicate the best results.

TABLE 9

Oxide (0.25 μm via)

| Rd. | Chem. | Kelvin 360 k (ohm) | yield | Coral compat. Blnkt | Trnch | HOSP compat. Blnkt | Trnch | LKD compat. Blnkt | Trnch | XLK compat. Blnkt | Trnch |
|---|---|---|---|---|---|---|---|---|---|---|---|
| 1 | IPA | — | | — | Y | Y | Y | Y | Y | Y | Y |
| | Y | | | | | | | | | | |
| | A | 4.67 | | 1 | Y | ? | Y | Y/N | Y/N | Y | N |
| | N | | | | | | | | | | |
| | B | 0.93 | | 1 | N | ? | N | Y | N | N | N |
| | N | | | | | | | | | | |
| | C | 0.47 | | 63 | Y | Y | Y | Y | N | N | N |
| | N | | | | | | | | | | |
| | D | 3.75 | 1 | Y | Y | Y | Y | N | N | N | N |
| | E | 0.53 | 32 | Y | Y | Y | Y | Y/N | Y | Y/N | N |

TABLE 9-continued

| | | Oxide (0.25 μm via) | | | | | | | | |
|---|---|---|---|---|---|---|---|---|---|---|
| | | Kelvin 360 k | | Coral compat. | | HOSP compat. | | LKD compat. | | XLK compat. |
| Rd. | Chem. | (ohm) | yield | Blnkt | Trnch | Blnkt | Trnch | Blnkt | Trnch | Blnkt | Trnch |
| | F | 0.49 | 42 | Y | Y | Y | Y | N | Y | N | N |
| 2 | None | 1.44 | | 2 | — | — | — | — | — | — | — |
| | G | 0.85 | | 22 | Y | Y | Y | Y | N | N | N |
| | H | 0.92 | 16 | Y | Y | Y/N | Y/N | N | N | N | N |
| | I | 0.50 | 1 | Y | Y | Y | Y | Y/N | Y | N | N |
| | J | 0.97 | 2 | Y | Y | Y | Y | Y/N | Y | N | N |
| | K | 0.46 | 0 | Y | Y | Y | Y | Y | Y | Y | Y |
| | L | 0.83 | 19 | Y | Y | Y | Y | N | N | N | N |

Y: Compatible
N (blanket): If color differs clearly or relevant FTIR (SiC-H, Si-H, Si-O) peak areas deviate >10% from control wafer
Y/N: 'borderline' case
?: Not enough data to judge

We claim:

1. A composition for stripping photoresist from substrates comprising:
    about 5% to about 50% by weight of an alkyl substituted pyrrolidone, an alkyl substituted piperidone, or a mixture thereof;
    about 0.2% to about 20% of one or more alkanolamines, and
    about 50% to about 94% of a sulfoxide, sulfoxone, or mixture thereof,
    wherein the composition removes copper from a copper substrate at a rate of less than about 10 Å per minute when the substrate is immersed in the composition which is held at 70° C. for 30 minutes and rotated relative to the composition at about 200 revolutions per minute; and
    wherein the composition comprises no more than about 2% water.

2. The composition of claim 1, wherein the composition comprises from about 15% to about 35% of an alkyl-2-pyrolidinone, from about 0.5% to about 10% of one or more alkanolamines, and from about 60% to about 84% of a sulfoxide, sulfoxone, or mixture thereof.

3. The composition of claim 1, wherein the composition comprises from about 20% to about 30% of an alkyl-2-pyrolidinone, from about 1% to about 5% of one or more alkanolamines, from about 66% to about 76% of a sulfoxide, sulfoxone, or mixture thereof.

4. The composition of claim 1, wherein: the substituted pyrrolidone, substituted piperidone, or mixture thereof consists essentially of N-methyl-2-pyrolidinone, N-hydroxyethyl-2-pyrrolidinone, or mixture thereof; the alkanolamine consists essentially of monoethanolamine, 2-(2-aminoethoxy)ethanol, 2-(2-aminoethylamino)ethanol, monoisopropanolamine, diethanolamine, triethanolamine, 2-(methylamino)ethanol, or a mixture thereof; and the sulfoxide, sulfoxone, or mixture thereof consists essentially of dimethyl sulfoxide (DMSO), dipropylsulfoxide, diethylsulfoxide, methylethylsulfoxide, diphenylsulfoxide, methylphenylsulfoxide, 1,1'-dihydroxyphenyl sulfoxide, or a mixture thereof, and wherein the composition removes copper from the copper substrate at a rate of less than about 5 Å per minute when the substrate is immersed in the composition which is held at 70° C. for 30 minutes and rotated relative to the composition at about 200 revolutions per minute.

5. The composition of claim 1, wherein: the substituted pyrrolidone, substituted piperidone, or mixture thereof consists essentially of N-methyl-2-pyrolidinone; the alkanolamine consists essentially of monoethanolamine, diethanolamine, 2-(methylamino)ethanol, or a mixture thereof; and the sulfoxide, sulfoxone, or mixture thereof consists essentially of dimethyl sulfoxide.

6. The composition of claim 1, comprising about 68% to about 74% of dimethyl sulfoxide, methyl sulfoxide, or mixture thereof; about 23% to about 29% of 1-Methyl-2-pyrrolidinone; and about 1% to about 5% of 2-(Methylamino)ethanol, diethanolamine, or mixture thereof.

7. The composition of claim 1, comprising no more than about 1% water.

8. The composition of claim 1, further comprising at least one of a surfactant, chelating agent, or corrosion inhibitor, wherein the total concentration of surfactants, chelating agents, and corrosion inhibitors is less than about 5% by weight.

9. A method of using the composition of claim 1 comprising:
    contacting the surface of a substrate with hardened photoresist thereon for a time and at a temperature sufficient to remove the photoresist; and
    rinsing the substrate with water, isopropyl alcohol, or a mixture thereof.

10. The method of claim 9, wherein a surface of the substrate comprises copper or a low-K material.

11. A composition for stripping photoresist from substrates comprising:
    about 15% to about 25% by weight of an alkyl substituted pyrrolidone, an alkyl substituted piperidone, or a mixture thereof;
    about 30% to about 50% of one or more alkanolamines;
    about 25% to about 45% of a substituted or unsubstituted sulfoxide, a substituted or unsubstituted sulfoxone, or a mixture thereof; and
    less than about 1% water,
    wherein the composition removes copper from a copper substrate at a rate of less than about 10 Å per minute when the substrate is immersed in the composition which is held at 70° C. for 30 minutes and rotated relative to the composition at about 200 revolutions per minute.

12. The composition of claim 11, comprising about 15% to about 25% of a substituted piperidone; 30% to about 50% of monoethanolamine, 2-(2-aminoethoxy)ethanol, 2-(2-aminoethylamino)ethanol, monoisopropanolamine, diethanolamine, triethanolamine, 2-(methylamino)ethanol, or a mixture thereof; and about 25% to about 45% of an alkylsulfoxide.

13. The composition of claim 11, comprising about 17% to about 23% of 1,3-dimethyl-2-piperidone, 1,5-dimethyl-2-piperidone, or a mixture thereof; about 40% to about 45% of monomethylethanolamine, diethanolamine, or a mixture thereof; about 30% to about 40% of dimethyl sulfoxide, methyl sulfoxide, or a mixture thereof.

14. The composition of claim 11, comprising at least one of gamma-butyrolactone, diglycolamine, propylene glycol, morpholine, and mixtures thereof.

15. The composition of claim 11, comprising at least one of a surfactant, a chelating agent, and a corrosion inhibitor, wherein the total concentration of surfactants, chelating agents, and corrosion inhibitors is less than about 5% by weight.

16. A method of using the composition of claim 11, comprising:
   contacting the surface of a substrate with hardened photoresist thereon with the composition of claim 11 for a time and at a temperature sufficient to remove the photoresist; and
   rinsing the substrate with water, isopropyl alcohol, or a mixture thereof.

17. The method of claim 16, wherein a surface of the substrate comprises copper or a low-K material.

18. A composition for stripping photoresist from substrates consisting essentially of:
   about 5% to about 50% by weight of an alkyl substituted pyrrolidone, an alkyl substituted piperidone, or a mixture thereof;
   about 0.2% to about 60% of one or more alkanolamines:
   about 20% to about 80% of alkylsulfoxide, alkylsulfone, or a mixture thereof;
   less than about 0.5% water;
   optionally at least one of gamma-butyrolactone, diglycolamine, propylene glycol, morpholine, and mixtures thereof; and
   optionally at least one of a surfactant, a chelating agent, and a corrosion inhibitor, wherein the total concentration of surfactants, chelating agents, and corrosion inhibitors is less than about 5% by weight;
   wherein the composition removes copper from a copper substrate at a rate of less than about 10 Å per minute when the substrate is immersed in the composition which is held at 70° C. for 30 minutes and rotated relative to the composition at about 200 revolutions per minute.

19. The composition of claim 18, comprising about 10% to about 35% of 1-hydroxyethyl-2-pyrolidinone, N-methyl-2-pyrolidinone, 1,3-dimethyl-2-piperidone, 1,5-dimethyl-2-piperidone, or a mixture thereof; about 2% to about 45% of monoethanolamine, diethanolamine, 2-(methylamino) ethanol, or a mixture thereof; and about 30% to about 75% of dimethyl sulfoxide, methyl sulfoxide, or a mixture thereof.

20. The composition of claim 18, comprising about 20% to about 26% of 1-hydroxyethyl-2-pyrolidinone, N-methyl-2-pyrolidinone, 1,3-dimethyl-2-piperidone, 1,5-dimethyl-2-piperidone, or a mixture thereof; about 2% to about 45% of monoethanolamine, diethanolamine, 2-(methylamino) ethanol, or a mixture thereof; and about 30% to about 75% of dimethyl sulfoxide, methyl sulfoxide, or a mixture thereof, and wherein the composition does not change the refractive index of both low-k substrate SIOC and HSQ by more than 0.02 when the substrate is immersed in the composition which is held at 70° C. for 30 minutes and rotated relative to the composition at about 200 revolutions per minute.

21. The composition of claim 18, wherein the composition removes copper from a copper substrate at a rate of less than about 5 Å per minute when the substrate is immersed in the composition which is held at 70° C. for 30 minutes and rotated relative to the composition at about 200 revolutions per minute.

22. The composition of claim 18, comprising at least one of gamma-butyrolactone, diglycolamine, propylene glycol, morpholine, and mixtures thereof.

23. The composition of claim 18, comprising at least one of a surfactant, a chelating agent, and a corrosion inhibitor, wherein the total concentration of surfactants, chelating agents, and corrosion inhibitors is less than about 5% by weight.

24. The composition of claim 18, which does not increase the copper etch rate for the composition more than about 4 Å per minute greater than the etch rate of the composition when waterless.

25. A method of stripping photoresist from a substrate comprising:
   contacting the composition of claim 18 with a surface of a substrate with hardened photoresist thereon for a time and at a temperature sufficient to remove the photoresist; and
   rinsing the substrate with water, isopropyl alcohol, or a mixture thereof.

26. The method of claim 25, wherein a surface of the substrate comprises copper or a low-K material.

27. The method of claim 25, wherein the time is between about 1 to about 60 minutes and the temperature is from about 45° C. to about 80° C.

28. A composition for stripping photoresist from substrates comprising: about 20% to about 30% of an alkyl-2-pyrolidinone, wherein the total amount of alkyl substituted pyrrolidone and alkyl substituted piperidone is 50% or less;
   about 1% to about 5% of one or more alkanolamines; and
   about 66% to about 76% of a sulfoxide, sulfoxone, or mixture thereof,
   wherein the composition removes copper from a copper substrate at a rate of less than about 10 Å per minute when the substrate is immersed in the composition which is held at 70° C. for 30 minutes and rotated relative to the composition at about 200 revolutions per minute.

29. A method of using the composition of claim 28, comprising:
   contacting the surface of a substrate with hardened photoresist thereon with the composition of claim 28 for a time and at a temperature sufficient to remove the photoresist; and rinsing the substrate with a rinse comprising water, isopropyl alcohol, or a mixture thereof.

30. The composition for stripping photoresist of claim 28 comprising:
   about 23% to about 29% of 1-Methyl-2-pyrrolidinone;
   about 1% to about 5% of 2-(Methylamino)ethanol, diethanolamine, or mixture thereof; and
   about 68% to about 74% of dimethyl sulfoxide, methyl sulfoxide, or mixture thereof.

31. A method of using the composition of claim 30, comprising:
  contacting the surface of a substrate with hardened photoresist thereon with the composition of claim 30 for a time and at a temperature sufficient to remove the photoresist; and rinsing the substrate with a rinse comprising water, isopropyl alcohol, or a mixture thereof.

32. The composition for stripping photoresist of claim 11 comprising:
  about 15% to about 25% of an alkyl-substituted piperidone;
  30% to about 50% of monoethanolamine, 2-(2-aminoethoxy)ethanol, 2-(2-aminoethylamino)ethanol, monoisopropanolamine, diethanolamine, triethanolamine, 2-(methylamino)ethanol, or a mixture thereof; and
  about 25% to about 45% of an alkyl-substituted sulfoxide.

33. A method of using the composition of claim 32, comprising:
  contacting the surface of a substrate with hardened photoresist thereon with the composition of claim 32 for a time and at a temperature sufficient to remove the photoresist; and rinsing the substrate with a rinse comprising water, isopropyl alcohol, or a mixture thereof.

34. A composition for stripping photoresist from substrates comprising:
  about 10% to about 30% by weight of an alkyl substituted pyrrolidone, an alkyl substituted piperidone, or a mixture thereof;
  about 20% to about 50% of one or more alkanolamines;
  about 20% to about 55% of an alkyl-substituted sulfoxide, an unsubstituted sulfoxide, an alkyl-substituted sulfoxone, an unsubstituted sulfoxone, or a mixture thereof;
  less than about 1% water; and
  further comprising at least one of gamma-butyrolactone, propylene glycol, or morpholine;
  wherein the composition removes copper from a copper substrate at a rate of less than about 10 Å per minute when the substrate is immersed in the composition which is held at 70° C. for 30 minutes and rotated relative to the composition at about 200 revolutions per minute.

35. A method of using the composition of claim 34, comprising:
  contacting the surface of a substrate with hardened photoresist thereon with the composition of claim 34 for a time and at a temperature sufficient to remove the photoresist; and rinsing the substrate with a rinse comprising water, isopropyl alcohol, or a mixture thereof.

36. A composition for stripping photoresist from substrates consisting essentially of:
  between about 15 parts to about 35 parts by weight of one or more substituted pyrrolidones, substituted piperidones, or mixture thereof;
  between about 1 part and about 5 parts by weight of one or more alkanolamines;
  between about 60 parts to about 84 parts of one or more alkylsulfoxides;
  optionally up to 10 parts by weight total of surfactants, chelating agents, and corrosion inhibitors; and
  less than about 4 parts by weight of water.

37. A method of using the composition of claim 36, comprising:
  contacting the surface of a substrate with hardened photoresist thereon with the composition of claim 36 for a time and at a temperature sufficient to remove the photoresist; and rinsing the substrate with a rinse comprising water, isopropyl alcohol, or a mixture thereof.

* * * * *